United States Patent
Song

(10) Patent No.: US 9,865,842 B2
(45) Date of Patent: Jan. 9, 2018

(54) OLED DISPLAY PANEL AND METHOD OF ENCAPSULATING THE SAME, AND DISPLAY DEVICE

(71) Applicant: BOE TECHNOLOGY GROUP CO., LTD., Beijing (CN)

(72) Inventor: Wenfeng Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/249,803

(22) Filed: Aug. 29, 2016

(65) Prior Publication Data
US 2017/0279076 A1 Sep. 28, 2017

(30) Foreign Application Priority Data

Mar. 22, 2016 (CN) .......................... 2016 1 0166245

(51) Int. Cl.
*H01L 51/52* (2006.01)
*H01L 51/56* (2006.01)

(52) U.S. Cl.
CPC ........ *H01L 51/5253* (2013.01); *H01L 51/525* (2013.01); *H01L 51/5246* (2013.01); *H01L 51/56* (2013.01)

(58) Field of Classification Search
CPC ... H01L 51/5253; H01L 51/56; H01L 51/525; H01L 51/5246
See application file for complete search history.

(56) References Cited

U.S. PATENT DOCUMENTS 8,283,688 B2 * 10/2012 Park ..................... H01L 51/525
257/98
8,445,923 B2 * 5/2013 Lee ..................... H01L 51/5237
257/88
(Continued)

FOREIGN PATENT DOCUMENTS

CN 101582488 A 11/2009
CN 102231427 A 11/2011
(Continued)

OTHER PUBLICATIONS

First Office Action assigned by the Chinese Patent Office in the priority Chinese Application No. 201610166245.0 dated Feb. 3, 2017.
(Continued)

*Primary Examiner* — William Coleman
(74) *Attorney, Agent, or Firm* — Dilworth & Barrese, LLP; Michael J. Musella

(57) ABSTRACT

An OLED display panel and a method of encapsulating the same, and a display device are disclosed. The OLED display panel includes: a first substrate and a second substrate which are disposed oppositely, a first sealing agent, a second sealing agent and a plurality of barrier blocks. The first sealing agent is provided between the first substrate and the second substrate and forms a sealing space with the first substrate and the second substrate; the second sealing agent is filled in the sealing space formed by the first substrate, the second substrate and the first sealing agent; and the plurality of barrier blocks are disposed in the sealing space formed by the first substrate, the second substrate and the first sealing agent and are arranged along the first sealing agent at an interval.

16 Claims, 4 Drawing Sheets

(56) References Cited

U.S. PATENT DOCUMENTS

| | | | |
|---|---|---|---|
| 9,525,153 B2* | 12/2016 | Oh | ................. H01L 51/524 |
| 2006/0100299 A1 | 5/2006 | Malik et al. | |
| 2010/0148127 A1 | 6/2010 | Ellinger et al. | |
| 2012/0080671 A1 | 4/2012 | Niboshi et al. | |
| 2016/0035996 A1* | 2/2016 | Sun | ................. H01L 21/77 257/40 |

FOREIGN PATENT DOCUMENTS

| | | |
|---|---|---|
| CN | 103337593 A | 10/2013 |
| CN | 103500755 | 1/2014 |
| CN | 203521418 U | 4/2014 |

OTHER PUBLICATIONS

Second Chinese Office Action dated Jun. 7, 2017.

\* cited by examiner

US 9,865,842 B2

OLED DISPLAY PANEL AND METHOD OF ENCAPSULATING THE SAME, AND DISPLAY DEVICE

TECHNICAL FIELD

Embodiments of the present disclosure relate to an organic light emitting diode (OLED) display panel and a method of encapsulating the same, and a display device.

BACKGROUND

Organic Light-Emitting Diode (abbreviated as OLED) devices have become the display technology of the next generation with strong competitiveness and bright prospects owing to their advantages such as solid-state structure, high brightness, wide viewing angle, quick response, flexible display and the like. Because organic light-emitting materials are extremely sensitive to water and oxygen, barrier property of 10E-6g/(m3day) is required to be achieved in terms of encapsulation in order to meet the normal life of OLED, which poses a great challenge to the development of encapsulation materials and processes.

Currently, frit encapsulation can meet the encapsulation requirements of high efficiency and high performance for small and medium-sized display panels, but cannot be applied to large-sized display fields. The frit-based surface encapsulation technology has become an option for encapsulating large-sized display devices.

Dam & Fill encapsulation, as an encapsulation manner, is extensively applied to fields of encapsulating various types of large-sized displays because the same encapsulating apparatus can meet the encapsulation requirements of display devices of different sizes. A dam with great water resistance and high viscosity and a filler material with filling properties and low viscosity constitute a dam & fill to ensure effective bonding of the first substrate and the second substrate together and to provide lateral water and oxygen resistant properties.

SUMMARY

An embodiment of the present disclosure provides an organic light-emitting diode (OLED) display panel, comprising: a first substrate and a second substrate which are disposed oppositely, a first sealing agent, a second sealing agent and a plurality of barrier blocks, wherein the first sealing agent is provided between the first substrate and the second substrate and forms a sealing space with the first substrate and the second substrate; the second sealing agent is filled in the sealing space formed by the first substrate, the second substrate and the first sealing agent; and the plurality of barrier blocks are disposed in the sealing space formed by the first substrate, the second substrate and the first sealing agent and are arranged along the first sealing agent at an interval.

Another embodiment of the present disclosure provides a method of encapsulating an organic light emitting diode (OLED) display panel, comprising: applying a first sealing agent around a substrate; providing a plurality of barrier blocks arranged at an interval along the first sealing agent on the substrate inside the first sealing agent; applying a second sealing agent on the substrate inside the plurality of barrier blocks; and cell-assembling another substrate with the substrate to form a display panel; wherein the barrier blocks are configured for slowing down a speed at which the second sealing agent on a side adjacent to the barrier blocks diffuses or runs towards the first sealing agent, and the first sealing agent, the second sealing agent and the barrier blocks are all disposed on the substrate.

Still another embodiment provides a display device comprising the above described display panel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
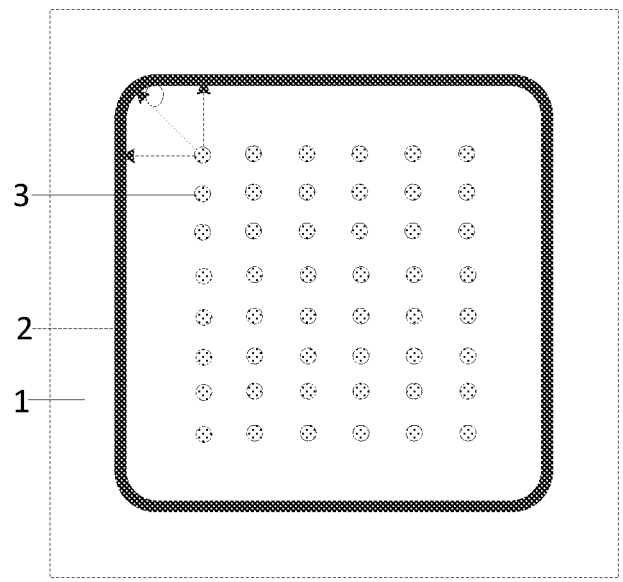
FIG. 1 is a schematic plan view of a dam & filler encapsulating process.

Nevertheless, dam & fill encapsulation still involves some technical problems. As illustrated in FIG. 1, after application of dam and filler, in the pressing process of the upper substrate to the lower substrate, if the pressure applied is too great, then the filler may readily breach the dam, which leads to encapsulation failure; if the pressure is too small, then there will be a gap between the filler and the dam and bubbles will be produced at a corner, which may not lead to effective contact, thus adversely affecting the encapsulating performance Besides, upon the erosion act of external water and oxygen as well as lighting and heating from OLED, the bevel tends to be first damaged. These factors may make it impossible to achieve full defect-free contact of the filler and the dam.

Figure 3:
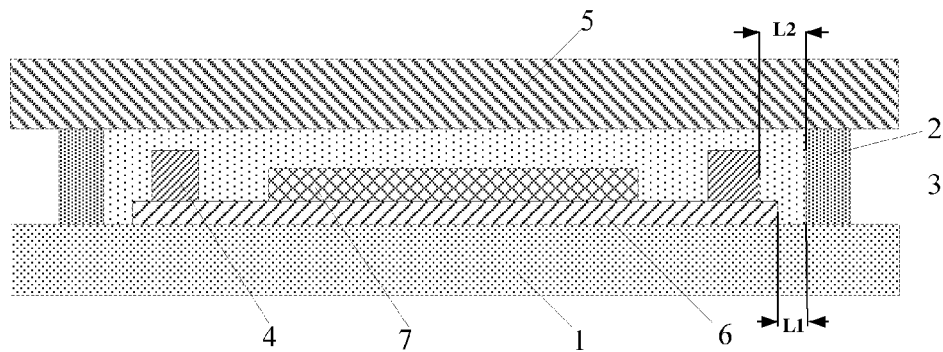
FIG. 3 is a cross-sectional schematic view of the OLED display panel as illustrated in FIG. 2.

FIG. 3 is a schematic view of an OLED display panel according to an embodiment of the present disclosure. As illustrated in FIG. 3, the OLED display panel comprises: a first substrate 1 and a second substrate 5 which are disposed oppositely, a first sealing agent 2, a second sealing agent 3, and a plurality of barrier blocks 4.

As illustrated in FIG. 3, the first sealing agent 2 is provided between the first substrate 1 and the second substrate 5, and is configured for forming a sealing space together with the first substrate 1 and the second substrate 5; the second sealing agent 3 is filled in the sealing space formed by the first substrate 1, the second substrate 5 and the first sealing agent 2; the barrier blocks 4 are disposed in the sealing space formed by the first substrate 1, the second substrate 5 and the first sealing agent 2, and the plurality of barrier blocks 4 are arranged along the first sealing agent 2 at an interval. The plurality of barrier blocks 4 are configured for slowing down the speed at which the second sealing agent 3 on a side adjacent to the barrier blocks 4 diffuses towards the first sealing agent 2.

The first sealing agent 2, the second sealing agent 3 and the barrier blocks 4 are all disposed on the first substrate 1 or on the second substrate 5. For example, the first sealing agent 2, the second sealing agent 3 and the barrier blocks 4 can be all disposed on the first substrate 1 (as illustrated in FIG. 3), or the first sealing agent 2, the second sealing agent 3 and the barrier blocks 4 are all disposed on the second substrate 5.

The cross-section of the barrier blocks 4 in a direction perpendicular to the substrate can be rectangular, e.g., a rectangle or square, and the cross-section can also be of other shapes, which will not be limitative in the present embodiment in this regard.

Figure 2:
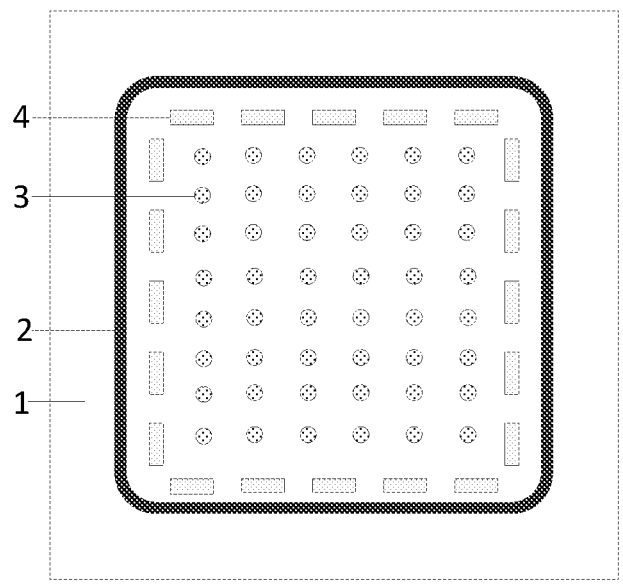
FIG. 2 is a schematic plan view of an OLED display panel according to an embodiment of the present disclosure.

It should be noted that FIG. 2 is a schematic plan view of an OLED display panel according to another embodiment of the present disclosure. The second sealing agent 3 in the embodiments of the present disclosure can be applied by means of dropping, screen printing, and the like, e.g., be uniformly applied onto the first substrate 1 (as illustrated in FIG. 2) or the second substrate 5, in which case the plurality of barrier blocks 4 are provided between the second sealing agent 3 and the first sealing agent 2, such that the plurality of barrier blocks 4 upon encapsulation can slow down the speed at which the second sealing agent 3 on a side adjacent to the barrier blocks 4 diffuses or runs towards the first sealing agent 2. The second sealing agent 3 is formed as spots, and its cross-section can be circular and its size can be set depending upon requirement.

In the embodiments of the present disclosure, a plurality of barrier blocks are provided in the sealing space formed by the first substrate, the second substrate and the first sealing agent and arranged along the first sealing agent at an interval; the dams formed by the barrier blocks along the first sealing agent are arranged at an interval, which can slow down the speed at which the second sealing agent diffuses or runs towards the first sealing agent such that the second sealing agent will not breach the first sealing agent; moreover, the barrier blocks can further make the speed at which the second sealing agent diffuses or runs towards the corner consistent, which avoids the problem of bubbles produced as a result of incomplete contact of the first sealing agent and the second sealing agent, thereby reducing the influence of adverse factors such as corner bubbles on the encapsulating performance of the display panel.

As illustrated in FIG. 2, for example, the plurality of barrier blocks 4 are arranged in rows and in columns at an interval, and the barrier blocks 4 arranged in rows or in columns are parallel to the first sealing agent 2 on a side of the display panel adjacent to the barrier blocks 4.

Further, the barrier blocks 4 arranged in rows and the barrier blocks 4 arranged in columns may not intersect at the corner of the substrate.

As such, the above plurality of barrier blocks 4 are arranged along the first sealing agent 2 in order, which can slow down the speed at which the second sealing agent 3 diffuses or runs towards the first sealing agent 2 such that the second sealing agent 3 diffuses towards various directions at a consistent speed, thereby achieving full contact of the first sealing agent 2 and the second sealing agent 3 while the first sealing agent 2 is not breached by the second sealing agent 3. This, as a consequence, ensures a good contact interface of the first sealing agent 2 and the second sealing agent 3 and improves the encapsulating performance and service life of the entire device.

As an example, FIG. 3 is a cross-sectional schematic view of the OLED display panel as illustrated in FIG. 2. As illustrated in FIG. 3, the OLED display panel comprises a first substrate 1 and a second substrate 5 which are disposed oppositely, and a first sealing agent 2, a second sealing agent 3 and barrier blocks 4 which are provided between the first substrate 1 and the second substrate 5.

Further, as illustrated in FIG. 3, the OLED display panel may further comprise a pixel defining layer 6 provided on the first substrate 1 and an OLED device 7 provided on the pixel defining layer 6. Referring to FIG. 3, the OLED device 7 is provided at a central position of the pixel defining layer 6. The OLED display panel may comprise a plurality of OLED devices 7 which are separated from each other by the pixel defining layer 6. Although FIG. 3 illustrates only one OLED device 7, the embodiments of the present disclosure are not limited thereto. Accordingly, the OLED display panel may further comprise a drive circuit for driving the OLED device 7, and the drive circuit can be a passive drive circuit or an active drive circuit.

If the first sealing agent 2, the second sealing agent 3, the pixel defining layer 6, and the barrier blocks 4 are provided on the first substrate 1, then the first sealing agent 2 is provided around the first substrate 1 and the distance between the first sealing agent 2 and the edge of the pixel defining layer 6 on the side adjacent to the first sealing agent 2 is a preset first distance L1; the second sealing agent 3 is provided between the first substrate 1 and the second substrate 5 and fully covers the OLED device 7; and the barrier blocks 4 are disposed inside the edge of the pixel defining layer 6 and the distance between each of the barrier blocks 4 and the edge of the first sealing agent 2 on the side adjacent to the barrier blocks 4 is a preset second distance L2. As illustrated in FIG. 3, the preset second distance L2 is greater than or equal to the preset first distance L1.

The first sealing agent 2 is provided between the first substrate 1 and the second substrate 5, and forms a sealing space with the first substrate 1 and the second substrate 5.

In the present embodiment, the pixel defining layer 6 is disposed on a side of the first substrate 1 facing towards the second substrate 5; the second sealing agent 3 is filled in the sealing space formed by the first substrate 1, the second substrate 5, and the first sealing agent 2, and contacts the surface of the OLED device 7. The barrier blocks 4 are provided within the sealing space formed by the first substrate 1, the second substrate 5, and the first sealing agent 2, are disposed inside the edge of the pixel defining layer 6, and contact the second sealing agent 3. It should be noted that the OLED display panel in the present embodiment is in the state after encapsulation; prior to encapsulation, the second sealing agent 3 is directly applied onto the surface of the OLED device 7 on a side facing towards the second substrate 5.

It can be appreciated that upon encapsulation, the first substrate 1 and the second substrate 5 are cell-assembled together, that is, the two substrates 1 and 5 are disposed oppositely to each other to form a cell, in which case the second sealing agent 3 diffuses towards all directions from the surface of the OLED device 7. Because the barrier blocks 4 are provided between the second sealing agent 3 and the first sealing agent 2, the speed at which the second sealing agent 3 diffuses or runs towards the first sealing agent 2 is slowed down such that the second sealing agent 3 diffuses towards various directions at the same speed and the first sealing agent 2 will not be breached with full contact of the second sealing agent 3 and the first sealing agent 2 but no bubbles.

It can be appreciated that the OLED device in the present embodiment may comprise an anode, an organic light-emitting layer and a cathode which are formed sequentially on the first substrate. Apparently, the OLED device may further comprise other structures, which will not be further detailed here.

It should be noted that the barrier blocks 4 and the pixel defining layer 6 in the present embodiment can be formed integrally, in this way process steps can be reduced accordingly. It can be appreciated the barrier blocks 4 and the pixel defining layer 6 can also be formed separately. No limitation will be made in the present embodiment in this regard.

Accordingly, the barrier blocks can be made of the same material such as epoxy based resin as the pixel defining layer.

Figure 4:
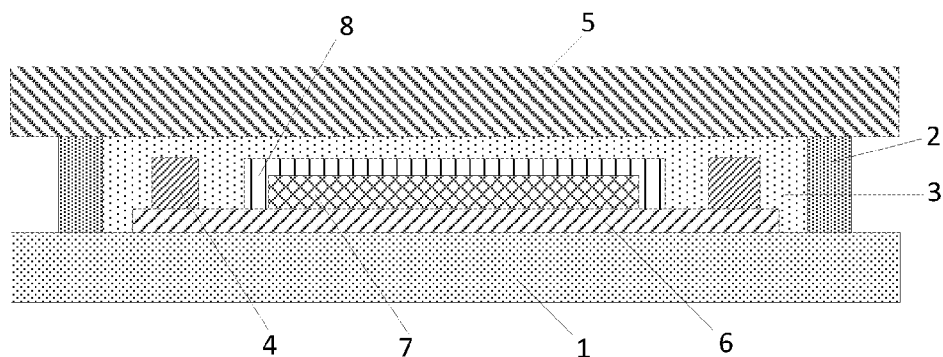
FIG. 4 is a cross-sectional schematic view of an OLED display panel according to another embodiment of the present disclosure.

Further, on the basis of the structure as illustrated in FIG. 3, FIG. 4 is a cross-sectional schematic view of an OLED display panel according to another embodiment of the present disclosure. As illustrated in FIG. 4, in addition to the structure that has been illustrated by FIG. 3, the OLED display panel may further comprise: a passivation layer 8 formed between the OLED device 7 and the second sealing agent 3 for preventing direct contact of the OLED device 7 and the second sealing agent 3.

As illustrated in FIG. 4, the passivation layer 8 fully covers the OLED device 7 and is in sealing connection with the pixel defining layer 6. As such, the passivation layer 8 can be used for further preventing the damage by substance such as water or oxygen to the OLED device 7. For example, the material of the passivation layer 8 can be inorganic passivation material, e.g., silicon nitride or silicon oxide.

The first sealing agent 2 is a dam adhesive, e.g., a UV-curable dam adhesive or a thermosetting dam adhesive, and the second sealing agent is a filling adhesive.

For example, the material for making the first sealing agent 2 is a liquid adhesive with great viscosity and strong water resistance, and the material for making the second sealing agent 3 is a hydrophobic liquid adhesive with small viscosity and great flowability. For example, the viscosity of the first sealing agent 2 is greater than the viscosity of the second sealing agent 3; the flowability of the first sealing agent 2 is smaller than the flowability of the second sealing agent 3. Thus, the second sealing agent 3 is filled within the sealing space formed by the first substrate 2, the second substrate 5 and the first sealing agent 2, thus certain flowability is required to achieve the final effect of being completely filled within the sealing space. In one embodiment of the present disclosure, the exemplary effective ingredient of the material for making the first sealing agent 2 is an epoxy resin, and the second sealing agent 3 may employ the same components as the first sealing agent 2 but at different proportions, i.e., the ratio of the effective ingredient in the material for making the second sealing agent 3 is less than the ratio of the effective ingredient in the material for making the first sealing agent 2 such that the second sealing agent 3 has certain flowability and can fill all gaps in the sealing space.

In addition, the sum of the height of the barrier blocks 4 and the height of the pixel defining layer 6 is less than the height of the first sealing agent 2. As such, the sealing space formed by the first substrate 1, the second substrate 5 and the first sealing agent 2 can fully accommodate the barrier blocks 4 disposed on the pixel defining layer 6.

Figure 5:
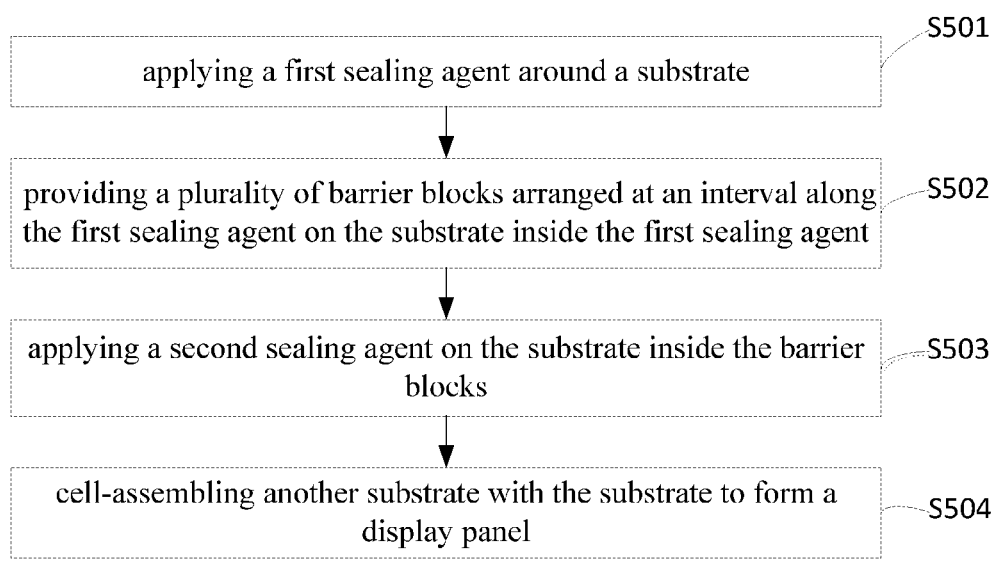
FIG. 5 is a flow chart of a method of encapsulating an OLED display panel according to an embodiment of the present disclosure.

FIG. 5 is a flow chart of a method of encapsulating an OLED display panel according to an embodiment of the present disclosure. As illustrated in FIG. 5, the method of the embodiment comprises the following steps S501-S504:

S501: applying a first sealing agent around a substrate.

The first sealing agent is formed around the edge of the substrate and has an overall shape of a rectangular frame. The material of the first sealing agent can be a liquid adhesive having great viscosity and strong water resistance such as a UV-curable dam adhesive or a thermosetting dam adhesive.

S502: providing a plurality of barrier blocks arranged at an interval along the first sealing agent on the substrate inside the first sealing agent.

The barrier blocks are configured for slowing down the speed at which the second sealing agent on a side adjacent to the barrier blocks diffuses towards the first sealing agent. For example, the cross-section of the barrier blocks can be rectangular or of other shapes, which will not be limited in the present embodiment in this regard.

S503: applying a second sealing agent on the substrate inside the barrier blocks.

For example, the second sealing agent is a filling adhesive, and the material for making it is a hydrophobic liquid adhesive having small viscosity and great flowability.

S504: cell-assembling another substrate with the substrate to form a display panel.

It should be noted that the first sealing agent, the second sealing agent and the barrier blocks are all disposed on the substrate.

It can be appreciated that the above steps S501 to S504 are conducted under vacuum condition.

As such, it can be seen that in the present embodiment, barrier blocks arranged at an interval along the dam are formed between the second sealing agent and the first sealing agent such that the speed at which the second sealing agent diffuses or runs towards the first sealing agent is slowed down and the first sealing agent will not be breached; meanwhile, the speed at which the second sealing agent diffuses towards the corner is consistent, which avoids the problem of bubbles produced as a result of incomplete contact of the first sealing agent and the second sealing agent, thereby reducing the influence of adverse factors such as corner bubbles on the encapsulating performance of the display panel.

Figure 11:
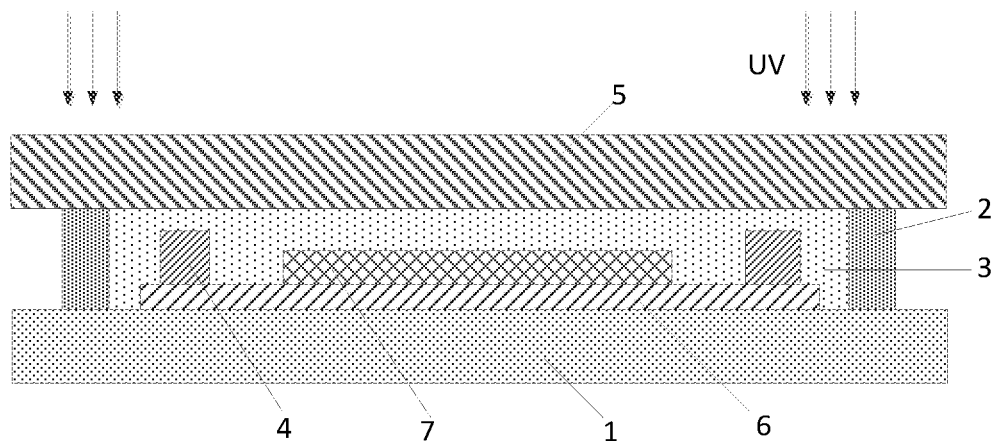
FIG. 11 is a schematic view of the curing process in the method of encapsulating an OLED display panel according to another embodiment of the present disclosure.

In order to set forth the technical solutions of the embodiments of the present disclosure more clearly, one specific embodiment of the present disclosure is illustrated as follows referring to the cross-sectional schematic views of the device structures formed in various steps. In the present embodiment, as shown in the final product structure as illustrated in FIG. 11, the first sealing agent, the second sealing agent, the pixel defining layer and the barrier blocks are all formed on the first substrate. Apparently, the display panel substrate may also comprise other structures, which will not be further detailed here. It should be appreciated that the structure shown here is exemplary, and there may be other structures according to the scope and spirit defined by the claims of the present disclosure.

Figure 6:
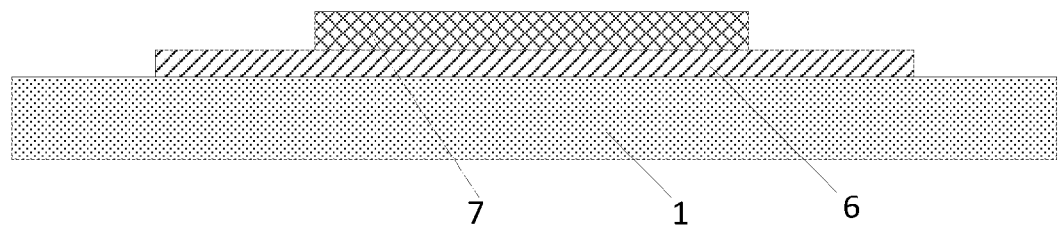
FIG. 6 is a schematic view of forming the pixel defining layer and the OLED device in the method of encapsulating an OLED display panel according to another embodiment of the present disclosure.

In the present embodiment, one example of the method of encapsulating an OLED display panel comprises the following steps S~S6:

S1: forming a pixel defining layer 6 and an OLED device 7 sequentially on a first substrate 1, as illustrated in FIG. 6.

The OLED device 7 is provided at a central position of the pixel defining layer 6.

Figure 7:
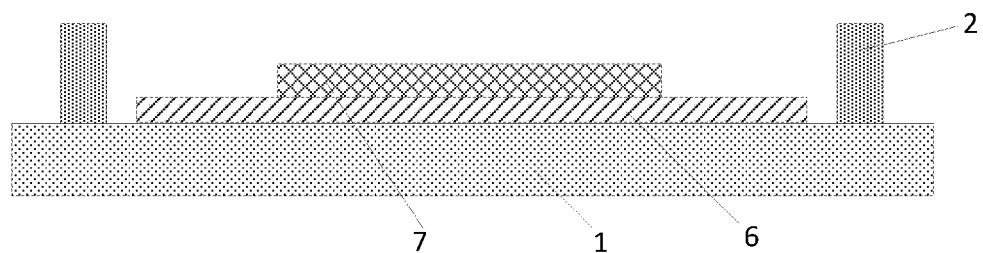
FIG. 7 is a schematic view of forming the first sealing agent in the method of encapsulating an OLED display panel according to another embodiment of the present disclosure.

S2: forming a first sealing agent 2 around the first substrate 1 and at a preset first distance between the first sealing agent 2 and the edge of the pixel defining layer 6 on the side adjacent to the first sealing agent 2, as illustrated in FIG. 7.

Figure 8:
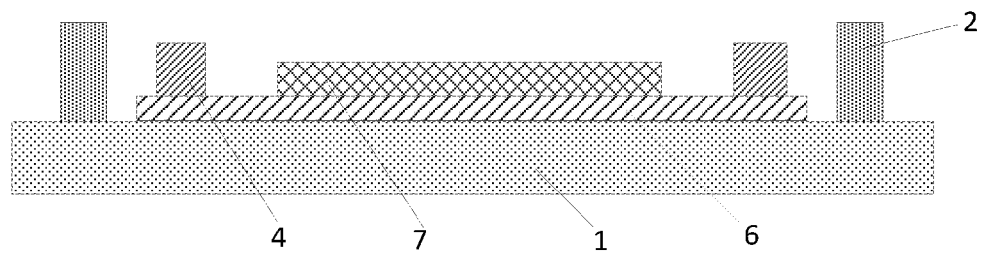
FIG. 8 is a schematic view of forming the barrier block in the method of encapsulating an OLED display panel according to another embodiment of the present disclosure.

S3: forming barrier blocks 4 at the edge of the pixel defining layer 6 and at a preset second distance between the pixel defining layer 6 and the first sealing agent 2, as illustrated in FIG. 8.

The barrier blocks 4 are arranged at an interval along the first sealing agent 2.

It should be noted that the barrier blocks 4 and the pixel defining layer 6 can be formed integrally.

Figure 9:
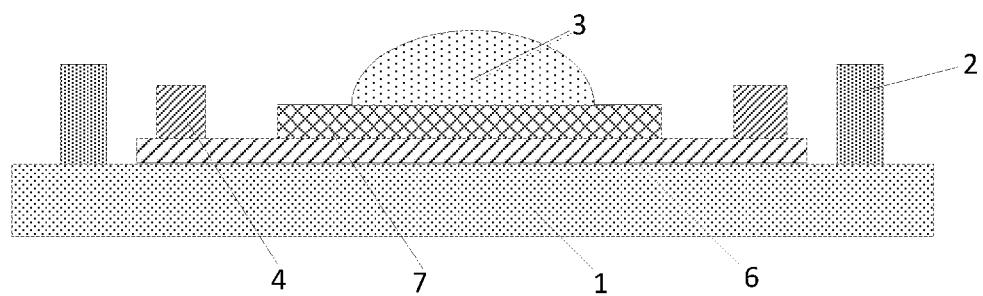
FIG. 9 is a schematic view of forming the second sealing agent in the method of encapsulating an OLED display panel according to another embodiment of the present disclosure.

S4: applying a second sealing agent 3 on the surface of the OLED device 7 on the side away from the pixel defining layer 6, as illustrated in FIG. 9.

The second sealing agent 3 can be applied by means of dropping, screen printing, and the like, e.g., be uniformly applied onto the first substrate 1, as illustrated in FIG. 2.

Figure 10:
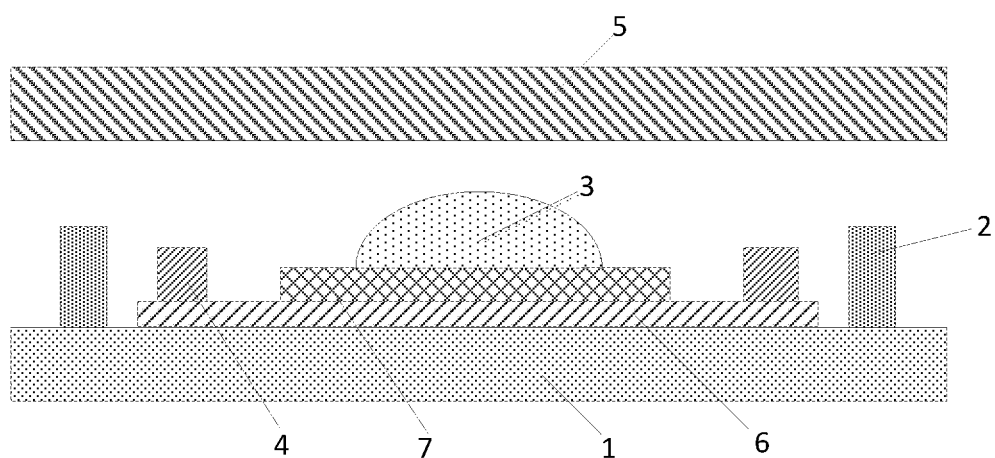
FIG. 10 is a schematic view of bonding a first substrate to a second substrate in the method of encapsulating an OLED display panel according to another embodiment of the present disclosure.

S5: applying a certain pressure to bond the first substrate 1 to the second substrate 5 so as to bring the first sealing agent 2 into full contact with the second sealing agent 3, as illustrated in FIG. 10.

S6: curing the first sealing agent 2, as illustrated in FIG. 11.

It can be appreciated that, if the first sealing agent 2 is a UV-curable adhesive, then the first sealing agent 2 is cured with light illumination; and if the first sealing agent 2 is a thermosetting adhesive, then the first sealing agent is cured with heating.

In another embodiment of the present disclosure, the above method further comprises the step of: forming a passivation layer over the OLED device, the passivation layer and the pixel defining layer being in sealing connection.

As such, the passivation layer in the present embodiment can prevent the OLED device from directly contacting the second sealing agent 3 so as to further prevent substance such as water or oxygen from damaging the OLED device.

In addition, the OLED display panel according to embodiments of the present disclosure can be obtained by any of the above methods of encapsulating an OLED device, which will not be further detailed here.

Another embodiment of the present disclosure provides a display device comprising any of the above OLED display panels, which may be: any product or component with display function such as a liquid display panel, a mobile phone, a tablet computer, a TV set, a laptop, a digital photo frame, a navigator, or the like. Because the display device is a display device comprising any of the above display panels, it can solve the same technical problem and achieve the same technical effect.

What are described above is related to the illustrative embodiments of the disclosure only and not limitative to the scope of the disclosure; the scopes of the disclosure are defined by the accompanying claims.

The application claims priority to the Chinese patent application No. 201610166245.0, filed Mar. 22, 2016, the entire disclosure of which is incorporated herein by reference as part of the present application.

What is claimed is:

1. An organic light-emitting diode (OLED) display panel, comprising: a first substrate and a second substrate which are disposed oppositely, a first sealing agent, a second sealing agent, a plurality of barrier blocks, a pixel defining layer provided on the first substrate, and an organic light-emitting diode (OLED) device provided on the pixel defining layer, wherein the first sealing agent is provided between the first substrate and the second substrate and forms a sealing space with the first substrate and the second substrate;

the second sealing agent is filled in the sealing space formed by the first substrate, the second substrate and the first sealing agent;

the plurality of barrier blocks are disposed in the sealing space formed by the first substrate, the second substrate and the first sealing agent and are arranged along the first sealing agent at an interval;

the OLED device being provided at a central position of the pixel defining layer;

the first sealing agent, the second sealing agent, and the pixel defining layer are provided on the first substrate;

the first sealing agent is provided around the first substrate, and a distance between the first sealing agent and an edge of the pixel defining layer on a side adjacent to the first sealing agent is a preset first distance;

the second sealing agent is provided between the first substrate and the second substrate and fully covers the OLED device;

the barrier blocks are disposed on an edge of the pixel defining layer, and a distance between each of the barrier blocks and an edge of the first sealing agent adjacent to the barrier blocks is a preset second distance; and the second distance is greater than or equal to the first distance.

2. The display panel according to claim 1, wherein the barrier blocks and the pixel defining layer are integrally formed.

3. The display panel according to claim 1, wherein the barrier blocks are made of a same material as the pixel defining layer.

4. The display panel according to claim 1, further comprising: a passivation layer formed, between the OLED device and the second sealing agent, for preventing direct contact of the OLED device and the second sealing agent.

5. The display panel according to claim 1, wherein the plurality of barrier blocks are arranged in rows and in columns at an interval, and the barrier blocks arranged in rows or in columns at an interval are parallel to the first sealing agent on a side adjacent to the barrier blocks.

6. The display panel according to claim 1, wherein a material for making the first sealing agent is a liquid adhesive with great viscosity and strong water resistance, and the material for making the second sealing agent is a hydrophobic liquid adhesive with small viscosity and great flowability.

7. The display panel according to claim 1, wherein a sum of a height of the barrier blocks and a height of the pixel defining layer is less than a height of the first sealing agent.

8. A display device, comprising the display panel according to claim 1.

9. The display panel according to claim 5, wherein the barrier blocks arranged in rows and the barrier blocks arranged in columns are provided without intersecting at a corner of the substrate.

10. A method of encapsulating an organic light emitting diode (OLED) display panel, comprising:
   applying a first sealing agent around a substrate;
   providing a plurality of barrier blocks arranged at an interval along the first sealing agent inside the first sealing agent;
   applying a second sealing agent on the substrate inside the plurality of barrier blocks; and
   cell-assembling another substrate with the substrate to form a display panel;
   wherein the barrier blocks are configured for slowing down a speed at which the second sealing agent on a side adjacent to the barrier blocks diffuses or runs towards the first sealing agent, and the first sealing agent, the second sealing agent and the barrier blocks are all disposed on the substrate;
   wherein a pixel defining layer and an organic light-emitting diode (OLED) device provided on the pixel defining layer are formed on the substrate, and the OLED device is provided at a central position of the pixel defining layer;
   wherein the first sealing agent is provided around the first substrate and a distance between the first sealing agent and an edge of the pixel defining layer on a side adjacent to the first sealing agent is a preset first distance,
   wherein the second sealing agent is provided between the first substrate and the second substrate and fully covers the OLED device,
   wherein the barrier blocks are disposed on an edge of the pixel defining layer and a distance between each of the barrier blocks and an edge of the first sealing agent on a side adjacent to the barrier blocks is a preset second distance; and
   wherein the second distance is greater than or equal to the first distance.

11. The method of encapsulating according to claim 10, wherein a passivation layer is formed over the OLED device; and the passivation layer and the pixel defining layer are in sealing connection.

12. The method of encapsulating according to claim 10, wherein the plurality of barrier blocks are arranged in rows and in columns at an interval, and the barrier blocks arranged in rows or in columns at an interval are parallel to the first sealing agent on a side adjacent to the barrier blocks.

13. The method of encapsulating according to claim 10, wherein a material for making the first sealing agent is a liquid adhesive with great viscosity and strong water resistance, and a material for making the second sealing agent is a hydrophobic liquid adhesive with small viscosity and great flowability.

14. The method of encapsulating according to claim 10, wherein a certain pressure is applied to bond the substrate to the another substrate to bring the first sealing agent into full contact with the second sealing agent so as to cell-assemble the another substrate with the substrate to form the display panel.

15. The method of encapsulating according to claim 10, wherein a sum of the height of the barrier blocks and a height of the pixel defining layer is less than a height of the first sealing agent.

16. The method of encapsulating according to claim 14, wherein the first scaling agent is cured after the another substrate and the substrate are bonded together.

* * * * *